United States Patent [19]

Phillips

[11] Patent Number: 5,187,429
[45] Date of Patent: Feb. 16, 1993

[54] REFERENCE VOLTAGE GENERATOR FOR DYNAMIC RANDOM ACCESS MEMORY

[75] Inventor: Richard S. Phillips, Constance Bay, Canada

[73] Assignee: Northern Telecom Limited, Montreal, Canada

[21] Appl. No.: 838,172

[22] Filed: Feb. 20, 1992

[51] Int. Cl.[5] ............................................. G05F 3/16
[52] U.S. Cl. .................................. 323/314; 323/315
[58] Field of Search ................... 307/296.1, 296.7; 323/313, 314, 315, 316

[56] References Cited

U.S. PATENT DOCUMENTS

| | | | |
|---|---|---|---|
| 4,135,125 | 1/1979 | Oura | 323/315 |
| 4,558,272 | 12/1985 | Grosch | 323/315 |
| 4,629,972 | 12/1986 | Briner et al. | 323/314 |
| 4,788,455 | 11/1988 | Mori et al. | 307/297 |
| 5,008,609 | 4/1991 | Fukiage | 363/313 |
| 5,109,187 | 4/1992 | Guliani | 323/313 |

OTHER PUBLICATIONS

Peter Gillingham et al., "High-Speed, High-Reliability Circuit Design for Megabit DRAM", IEEE Journal of Solid-State Circuits, vol. 26, No. 8, Aug. 1991, pp. 1171-1175.

Primary Examiner—Steven L. Stephan
Attorney, Agent, or Firm—John E. Mowle

[57] ABSTRACT

A reference voltage generator can provide RAMs (random access memories) with a reference voltage (generally mid-way between a supply voltage and a common potential), with improved follower characteristics. When the supply voltage and/or the load condition of the RAMs are significantly altered, the reference voltage is rapidly adjusted by dynamic switching FETs, being pulled down or up. Under balanced conditions when essentially no current flows in the switching FETs, overall power consumption is low.

9 Claims, 4 Drawing Sheets

REFERENCE VOLTAGE GENERATOR FOR DYNAMIC RANDOM ACCESS MEMORY

FIELD OF THE INVENTION

The present invention relates to a reference voltage generator which is particularly suited for providing a reference voltage to dummy cells, bit lines etc. of a DRAM (dynamic random access memory). A DRAM and a reference voltage generator are implemented in a MOS device chip, for example.

BACKGROUND OF THE INVENTION

In the read and refresh operation cycles of a DRAM, the charge on a memory cell capacitor, representing one bit (binary digit) of the memory which may be "0" or "1", is effectively compared with the charge on a reference cell capacitor to determine whether the bit is "0" or "1". For the best signal margin, i.e. discrimination between the "0" and "1" charge states, the reference cell capacitor is desirably charged to a midpoint voltage which is mid-way between the voltages of the memory cell capacitor representing the "0" and "1" bits. After each read or refresh operation, the charge on the reference cell capacitor must be restored. Normally, the voltages corresponding to the "0" and "1" are a ground potential (0 volts) and a supply voltage (e.g. 5.0 volts), respectively. Thus, the midpoint voltage is a half of the supply voltage.

A reference voltage generator, which can provide such a midpoint reference voltage to bit lines of a DRAM, is disclosed, for example, in FIG. 3 of an article by Peter Gillingham, Richard C. Foss, Valerie Lines, Gregg Shimokura, and Tomasz Wojcicki. "High-Speed, High-Reliability Circuit Design for Megabit DRAM", IEEE JOURNAL OF SOLID-STATE CIRCUITS, VOL. 26, NO. 8, AUGUST 1991, pp. 1171–1175. As shown in FIG. 1 illustrating the prior art herein, that circuit comprises a high impedance bias network stage of a P-channel type FET 11, an N-channel type FET 13, a P-channel type FET 15 and an N-channel type FET 17, which are connected in series between a voltage supply terminal and a ground terminal, or a common potential terminal (0 volt level). The circuit also comprises a complementary source follower output stage of N- and P-channel type FETs 19 and 21, connected in series between io the voltage supply terminal and the ground terminal. The gates of the FETs 19 and 21 are connected to the gates and drains of the FETs 13 and 15, respectively. The bodies of the P-channel FETs 11, 15 and 21 are connected to the sources thereof. A juncture of the sources of both FETs 13 and 15 is referred to as a "node A". A juncture of the sources of both FETs 19 and 21 is referred to as a "node B". The node B is connected to a reference voltage output terminal from which a reference voltage VREF is provided to bit lines of a DRAM (not shown). A juncture of the gates of both FETs 13 and 19 is referred to as a "node C". In addition, a juncture of the gates of both FETs 15 and 21 is referred to as a "node D".

A DC voltage VDD (typically 5.0 volts) is fed to the voltage supply terminal and a current (e.g. 250 Å) flows in the high impedance bias network stage. The FETs 11 and 17 function as resistance elements. A midpoint voltage of VDD/2 (=2.5 volts) is provided at node A. Typical potentials at node A-D are shown in Table I with and without the connection 21A between the body and source of the FET 21.

TABLE I

| Node | Potentials (volts) with connection 21A | Potentials (volts) without connection 21A |
| --- | --- | --- |
| VDD | 5.0 | 5.0 |
| A | 2.5 | 2.5 |
| B | 2.5 | (2.5–2.8) |
| C | 3.5 | 3.5 |
| D | 1.8 | 1.8 |

With the connection 21A, the gate-source bias voltages of the FETs 19 and 21 respectively are the same as those of the FETs 13 and 15, and the reference voltage VREF at node B is the midpoint voltage, which is fed to the DRAM. When the supply voltage VDD changes, the reference voltage VREF has to change to a new midpoint voltage, in order for the DRAM to correctly operate. Also, when the reference voltage VREF changes due to an alteration of the load condition of the DRAM, the reference voltage VREF has to be corrected to the midpoint voltage. Accordingly, the reference voltage generator has to be able to rapidly respond to such voltage changes. Since an input capacitor of the DRAM is large (e.g. in the order of 100 pF), a large current must flow in the FET 19 or 21, to minimize the correction time of the reference voltage VREF. Also, under balanced conditions, a large current (e.g. 10 mA) continues to flow in the FETs 19 and 21. In order for the reference voltage generator to provide an adequate transient response to the output voltage changes, the physical widths of the FETs 19 and 21 must be large, resulting in a large quiescent power consumption. Typical example dimensions of the width W($\mu$m) of the FET channel and the distance L($\mu$m) between the source and the drain thereof are as follows:

FET 11: 10 and 3
FET 13: 100 and 3
FET 15: 200 and 3
FET 17: 3.2 and 3
FET 19: 2000 and 1.2
FET 21: 4000 and 1.2

A reduction in the current flowing in the complementary source follower output stage and the FETs' sizes, can be achieved by removing the connection 21A between the body and the source of the FET 21. It results in an increase in the threshold voltage of the FET 21. As the reference voltage VREF at node B approaches that at node A, little current flows in the FETs 19 and 21, resulting in a high impedance at node B.

When the supply voltage VDD changes or when the reference voltage VREF changes due to a change in the load condition of the DRAM, the reference voltage VREF has to be corrected to the midpoint voltage. For example, when the reference voltage VREF changes from 2.5 to 2.7 volts, the gate-source bias voltages of the FETs 19 and 21 are 0.9 volts. Due to the increased threshold voltage, neither FET 19 nor FET 21 is turned on, so that neither FET 19 nor FET 21 correct the reference voltage VREF. As shown in Table I, there is a .dead zone of about 0.3 volts (e.g. 2.5–2.18 volts) in which the FET 19 or 21 cannot pull up or down the changed reference voltage. Therefore, the voltage at node B tends to drift about the midpoint voltage of the dead zone.

As described, the prior art reference voltage generator has disadvantages—either the necessity for a large chip area for the FETs of the complementary source follower output stage in the device forming the reference voltage generator resulting in high power consumption, or poor transient speed in response to a voltage change.

SUMMARY OF THE INVENTION

The present invention provides a reference voltage generator which overcomes the disadvantages described above.

According to the most general aspect of the present invention, a reference voltage generator according to the present invention comprises: first, second and third FETs of a first channel type, each having a gate, a drain and a source; fourth, fifth and sixth FETs of a second channel type opposite to the first channel type, each having a gate, a drain and a source; a first resistance element connected between a first voltage terminal and the gate and drain of the first FET; a second resistance element connected between a second voltage terminal and the gate and drain of the fourth FET; a third resistance element connected between the a first voltage terminal and the drain of the second FET; and a fourth resistance element connected between the second voltage terminal and the drain of the fifth FET. In the reference voltage generator, the sources of both first and fourth FETs are connected to each other; the gates of the second and fifth FETs are connected to the gates of the first and fourth FETs, respectively; the gates of the third and sixth FETs are connected to the drains of the fifth and second FETs, respectively; the sources of the third and sixth FETs are connected to the second voltage terminal and the first voltage terminal, respectively; and the sources of the second and fifth FETs and the drains of the sixth and third FETs are connected to a reference voltage output terminal; and the resistance values of the third and fourth resistance elements are selected so that the sixth and third FETs are essentially non-conductive under balanced conditions.

In a preferred embodiment, the first to third FETs are of N-channel type and the fourth to sixth FETs are of P-channel type.

The midpoint voltage is provided at the juncture of the sources of the first and fourth FET. The output reference voltage is controlled so that it is equal to the midpoint voltage, with the second and fifth FETs. Under balanced conditions, the third and sixth FETs are essentially non-conductive. No large current needs to flow in the second and fifth FETs. When the supply voltage or the load condition changes, the second or fifth FET turns on the sixth or third FET, so that the reference voltage is pulled up or down and rapidly adjusted. With decreased current flowing in the FETs, not only is the power consumption low, but even the physical dimensions of the devices—the width of the FET channel and the distance between the source and the drain of the FET—are small.

According to another aspect of the present invention, a reference voltage generator further comprises a reference voltage shift means imposed in the high impedance bias network stage. In the reference voltage generator, a reference voltage off-set from the midpoint voltage is provided.

According to another aspect of the present invention, a reference voltage generator further comprises fifth and sixth resistance elements. The fifth resistance element is connected between the source of the third FET and the reference voltage output terminal. The sixth resistance element is connected between the reference voltage output terminal and the source of the fourth FET. With each of the fifth and sixth resistance elements, the current flowing in the second or fifth FET is reduced.

All resistance elements may be of drain-source resistances of FETs. Thereby, the reference voltage generator can be fabricated on a single device chip with FETs.

In the reference voltage generator according to the present invention, response time for correcting the voltage deviation is short, the quiescent current under balanced conditions is small, and the device density in the device chip for implementing the reference voltage generator is improved.

BRIEF DESCRIPTION OF THE DRAWINGS

The present invention will be further understood from the following description with reference to the accompanying drawings, in which.

DETAILED DESCRPTION OF THE PREFERRED EMBODIMENT

The following description assumes, for simplicity and purely by way of example, that the FETs referred to are MOS devices and the supply voltage is 5.0 volts.

I. FIRST EMBODIMENT (i) Structure of the Circuit

Figure 1:
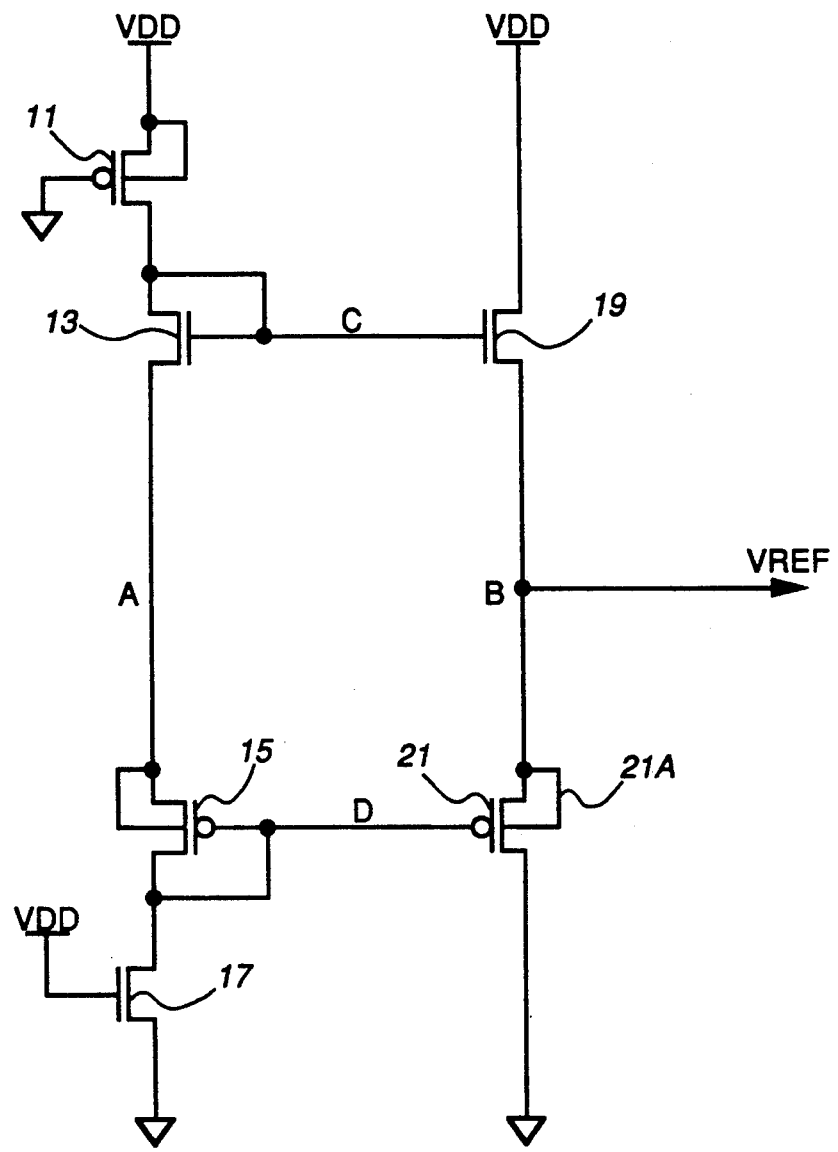
FIG. 1 illustrates a circuit diagram of a prior art reference voltage generator.
Figure 2:
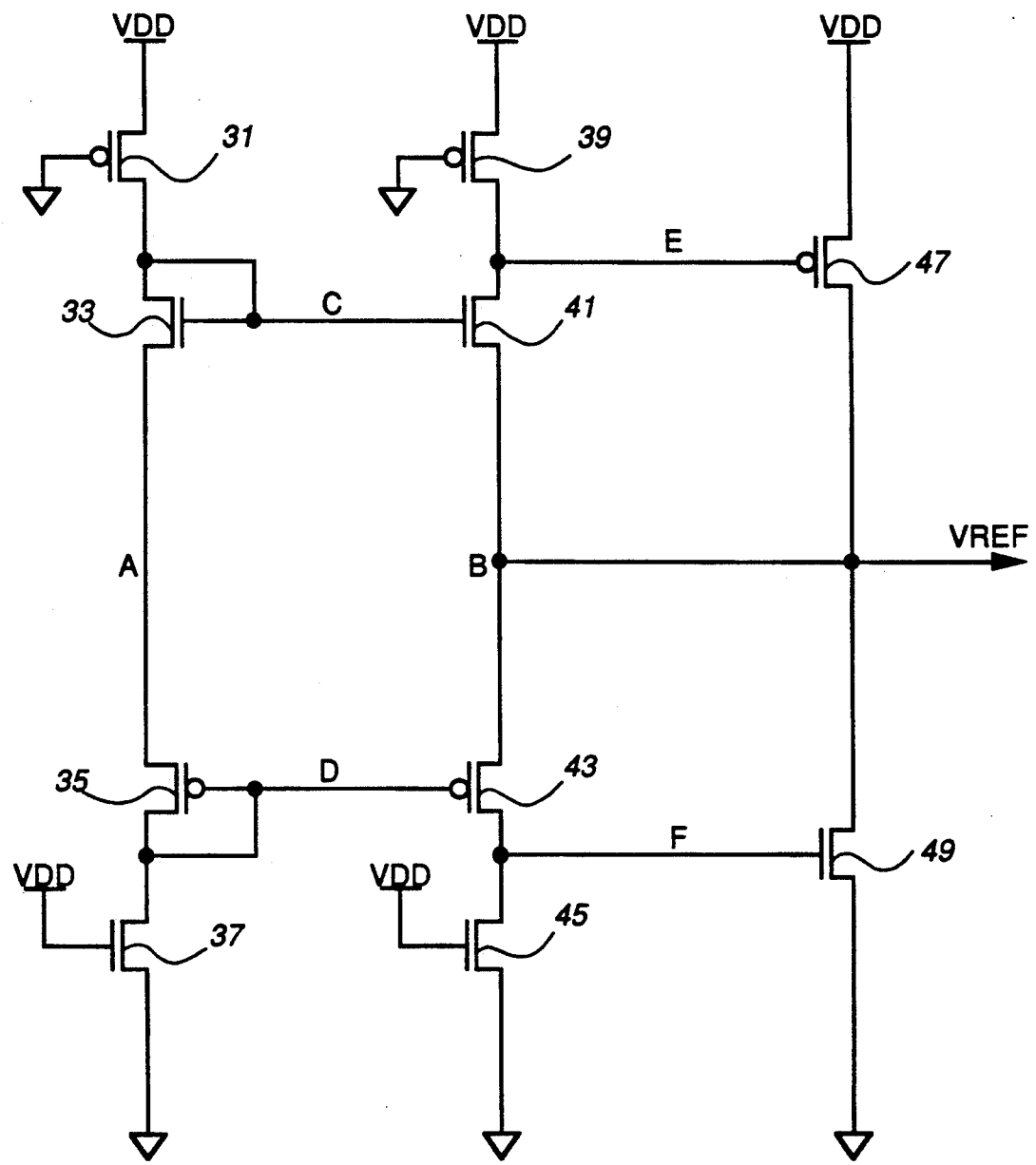
FIG. 2 illustrates a circuit diagram of an embodiment of a reference voltage generator according to the present invention.

Referring to FIG. 2, a circuit of the reference voltage generator comprises a high impedance bias network stage, a complementary source follower stage and a common source push-pull output stage.

The bias network stage includes a P-channel type FET 31, an N-channel type FET 33, a P-channel type FET 35 and an N-channel type FET 37, which are connected in series between a voltage supply terminal and a ground terminal. A voltage VDD is fed to the voltage supply terminal. The ground terminal is a common potential terminal (0 volt level). The gates and drain of the FETs 33 and 35 respectively are connected to each other. The drains and gates of both FETs 33 and 35 are connected to each other. The FETs 31 and 37 function as resistance elements.

The complementary source follower stage of the circuit includes a P-channel type FET 39, an N-channel type FET 41, a P-channel type FET 43, and an N-channel type FET 45. Those FETs are connected in series between the voltage supply terminal and the ground terminal. The gates of the FETs 41 and 43 are connected to the gates of the FETs 33 and 35, respectively. The FETs 39 and 45 merely function as resistance elements. A juncture of both sources of the FETs 33 and 35 is referred to as a "node A".

The common source push-pull output stage of the circuit shown in FIG. 2 has a P-channel type FET 47 and an N-channel type FET 49. The source, gate and drain of the FET 47 are connected to the voltage supply terminal, the drain of the FET 41 and the reference voltage output terminal, respectively. The drain, gate and source of the FET 49 are connected to the reference voltage output terminal, the drain of the FET 43 and the ground terminal, respectively. A juncture, referred to as a "node B", of both sources of the FETs 41, 43 and both drains of the FETs 47, 49, is the reference voltage output terminal which is connected to bit lines of a DRAM (not shown). The gates of the FETs 41, 43, 47 and 49 are referred to as node C, D, E and F, respectively.

In the embodiment, typical dimensions of the width W($\mu$m) of the FET channel and the distance L($\mu$m) between the source and the drain thereof are as follows:
FET 31: 10 and 3
FET 33: 100 and 3
FET 35: 200 and 3
FET 37: 3.2 and 3
FET 39: 3.5 and 1.2
FET 41: 25 and 1.5
FET 43: 25 and 1.5
FET 45: 3.2 and 3
FET 47: 800 and 1.2
FET 49: 400 and 1.2

(ii) Operation of the Circuit

The DC voltage VDD (5.0 volts) is fed to the voltage supply terminal. Current flowing in the FETs 31, 33, 35 and 37 results in the voltage drop across the source-drain of the FET 31 and the drain-source of the FET 37 being equal. Concurrently the voltage drop across the drain-source of the FET 33 is the same as that of the source-drain of the FET 35, so that the node A potential is VDD/2 (=2.5 volts).

At the complementary source follower stage comprising the FETs 41 and 43, the reference voltage VREF will follow the node A potential, VDD/2, in a similar manner to that of the prior art. Thus, the reference voltage generator shown in FIG. 2 provides the bit lines of the DRAM with a reference voltage VREF which tracks the node A potential.

Under balanced conditions, the reference voltage VREF is 2.5 volts and a small current (e.g. 500 $\mu$A) flows in the series connected FETs 39–45. Table II shows example node potentials in the circuit.

It should be noted that the FETs, threshold voltages will depend, to some extent, upon the physical size of the design and/or the manufacturing process. The voltages and/or potentials described here are only examples.

TABLE II

| Node | Potentials (volts) |
|---|---|
| VDD | 5.0 |
| A | 2.5 |
| B | 2.5 |
| C | 3.5 |
| D | 1.5 |
| E | 4.6 |
| F | 0.4 |

As is apparent from Table II, both gate-source bias voltages of 0.4 volts for the FETs 47 and 49 of the common source push-pull output stage are insufficient to turn them on, so that they are essentially non-conducting under balanced conditions.

When the reference voltage VREF changes from 2.5 volts (the midpoint voltage) to say 2.7 volts, the gate-source bias voltage of the FET 43 increases by 0.2 volts. The 0.2 volt deviation is amplified by the FET 43 so that its drain potential (at node F) increases. If the voltage amplification of the FET 43 is greater than three, the node F potential increases to more than 1.0 volt. With a sufficient bias voltage between the gate and source, the FET 49 is immediately turned on, so that the increased reference voltage VREF is rapidly pulled down.

Also, when the reference voltage VREF decreases from 2.5 to 2.3 volts, the 0.2 volt deviation is amplified by the FET 41. The node E potential decreases, so that with a sufficient gate-source bias, the FET 47 is turned on. The decreased reference voltage VREF is rapidly pulled up.

In addition, when the supply voltage VDD changes from 5.0 to 5.6 volts, for instance, because of a voltage deviation, the node A potential quickly changes to a new midpoint voltage VDD/2 (=5.6/2 volts). At the same time, due to the source potential of the FET 47 being higher, the gate-source bias voltage thereof increases enough to turn on the FET 47. Accordingly, with the FET 47 conducting, the node B potential is rapidly pulled-up. Then, by the complementary source follower stage of the FETs 41 and 43, the reference voltage VREF is adjusted to be equal to the new midpoint voltage. In case the VDD decreases, the FET 49 is turned on, so that the reference voltage VREF is rapidly pulled down and adjusted to a new midpoint voltage. Once the circuit is balanced, the FETs 47 and 49 are again turned off. Since under balanced conditions, no large currents need to flow in the FETs 41 and 43 and essentially no current flows in FETs 47 and 49, the power consumption of the reference voltage generator is decreased and the overall areas of these FETs can be reduced, even though the number of devices is increased.

II. SECOND EMBODIMENT

Figure 3:
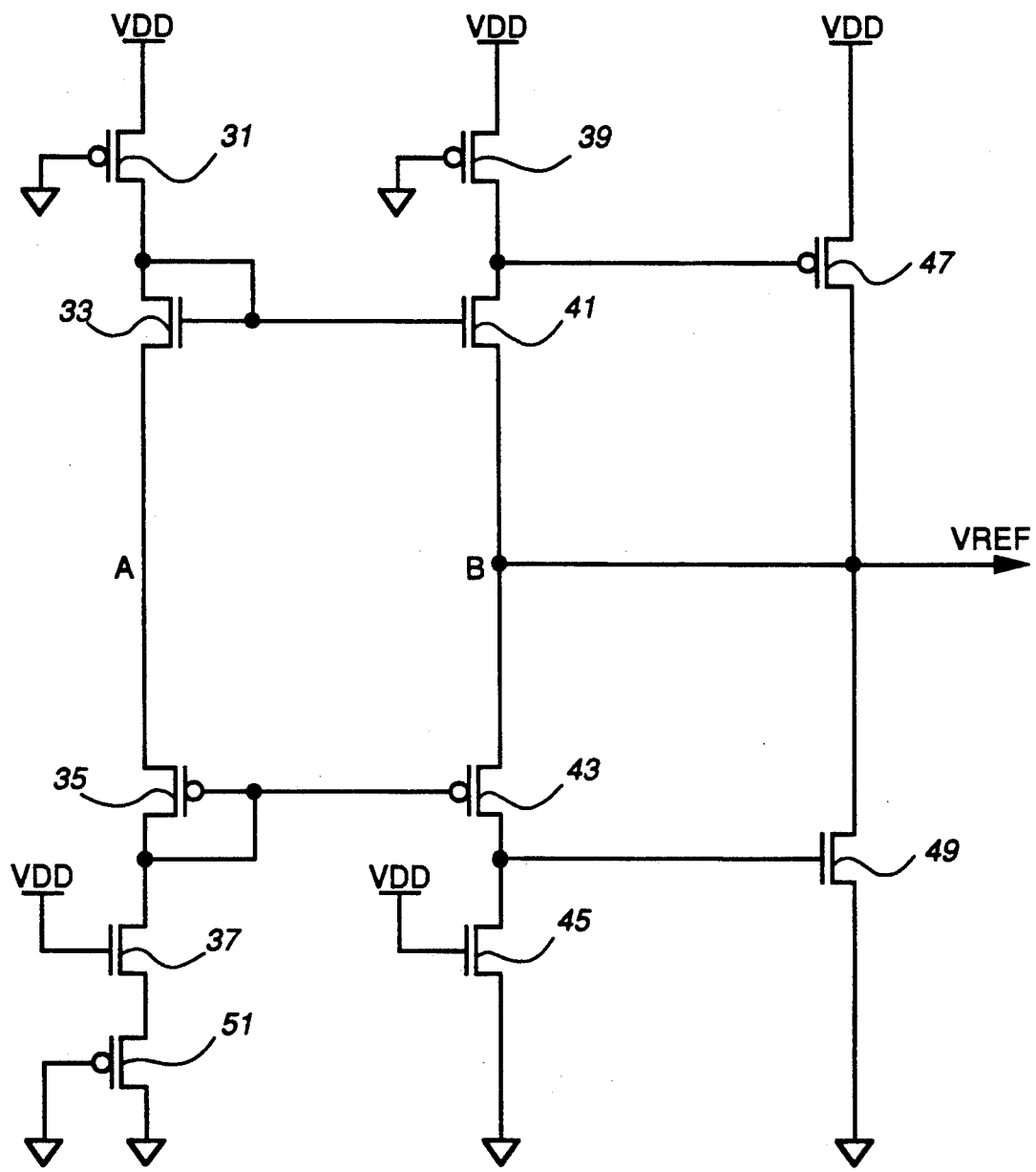
FIG. 3 illustrates a circuit diagram of another embodiment of a reference voltage generator according to the present invention.

FIG. 3 shows another embodiment of a reference voltage generator in which a P-channel type FET 51, whose dimensions W and L are 200 ($\mu$m) and 1.44 ($\mu$m), is added to the circuit shown in FIG. 2. The source-drain of the FET 51 is imposed between the source of the FET 37 and the ground terminal. With a voltage drop across the source-drain of the FET 51, VSD51, the node A potential is shifted up by VSD51/2.

Since the node B potential tracks the node A potential, this circuit provides a higher reference voltage VREF by VSD51/2 than the circuit shown in FIG. 3. Such a higher reference voltage VREF can be applied to a DRAM which needs a higher reference voltage than the midpoint voltage between the supply voltage VDD and the ground potential (0 volts). It can track the logic "0" level voltage of the DRAM which is above the ground potential.

In case the reference voltage VREF must be lower than the midpoint voltage for the DRAM, a voltage shift device (e.g. an FET) may be imposed between the voltage supply terminal and the source of the FET 33. With such an additional voltage shift device, the node B potential is lower than the midpoint voltage, so that a lower reference voltage VREF can be provided.

III. Third Embodiment

Figure 4:
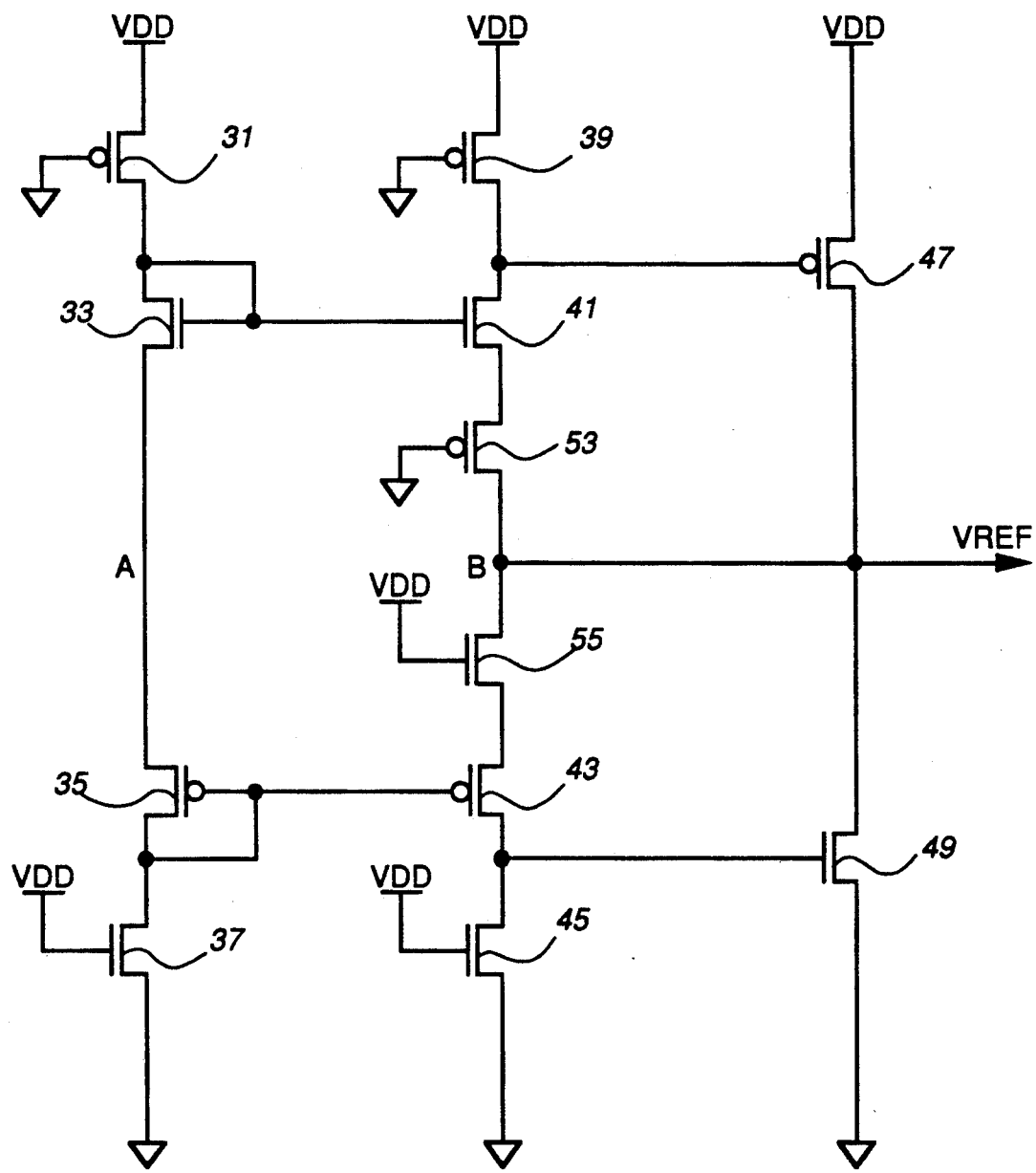
FIG. 4 illustrates a circuit diagram of another embod a reference voltage generator according to the present invention.

FIG. 4 shows another embodiment of a reference voltage generator in which series connected P- and N-channel type FETs 53 and 55 are imposed between the sources of the FETs 41 and 43. The drains of both FETs 53 and 55 are connected to the reference voltage output terminal. The FETs 53 and 55 function as resistance elements. Operation is much the same as that of the circuit shown in FIG. 2, except that the FETs 53 and 55 reduce the current flowing in the FET 41 and 43 under balanced conditions.

IV. OTHERS

In the embodiments the FETs 31, 37, 39, 45, 53 and 55 are resistance elements and can be replaced by other resistance elements such as diodes. Also, the FET 51 can be replaced by other voltage shift devices such as semiconductor devices.

It is also possible to raise or lower the reference voltage VREF, by changing the relative sizes of the FETs 31 and 37.

What is claimed is:

1. A reference voltage generator comprising:
   first, second and third FETs of a first channel type, each having a gate, a drain and a source;
   fourth, fifth and sixth FETs of a second channel type opposite to said first channel type, each having a gate, a drain and a source;
   a first resistance element connected between a first voltage terminal and the gate and drain of said first FET;
   a second resistance element connected between a second voltage terminal and the gate and drain of said fourth FET;
   a third resistance element connected between the first voltage terminal and the drain of said second FET; and
   a fourth resistance element connected between the second voltage terminal and the drain of said fifth FET,
   in which:
   the sources of both first and fourth FETs are connected to each other;
   the gates of said second and fifth FETs are connected to the gates of said first and fourth FETs, respectively;
   the gates of said third and sixth FETs are connected to the drains of said fifth and second FETs, respectively;
   the sources of said third and sixth FETs are connected to the second voltage terminal, respectively;
   the sources of said second and fifth FETs and the drains of said sixth and third FETs are connected to a reference voltage output terminal; and
   the resistance values of said third and fourth resistance elements are selected so that said sixth and third FETs are essentially non-conductive under balanced conditions.

2. A reference voltage generator according to claim 1, wherein said first and second channel types are N- and P-channel types or P- and N-channel types.

3. A reference voltage generator according to claim 1, wherein the first to fourth resistance elements are semiconductor devices.

4. A reference voltage generator according to claim 3, wherein said semiconductor devices are FETs.

5. A reference voltage generator according to claim 1, further comprising a reference voltage shift means connected between the second resistance element and the second voltage terminal or between the first resistance element and the first voltage terminal.

6. A reference voltage generator according to claim 5, wherein said reference voltage shift means is a semiconductor device which functions as a resistance element.

7. A reference voltage generator according to claim 6, wherein said semiconductor device is a FET.

8. A reference voltage generator according to claim 1, further comprising fifth and sixth resistance elements, wherein,
   said fifth resistance element is connected between the source of said second FET and the reference voltage output terminal, and
   said sixth resistance element is connected between the reference voltage output terminal and the source of said fifth FET.

9. A reference voltage generator according to claim 1 or 5, wherein the first and second voltage potential terminals are a pair of common potential and voltage supply terminals.

* * * * *